(12) United States Patent
Kumar et al.

(10) Patent No.: US 8,598,891 B2
(45) Date of Patent: Dec. 3, 2013

(54) DETECTION AND MITIGATION OF PARTICLE CONTAMINANTS IN MEMS DEVICES

(71) Applicant: Analog Devices, Inc., Norwood, MA (US)

(72) Inventors: Vineet Kumar, Wakefield, MA (US); William A. Clark, Winchester, MA (US); John A. Geen, Tewksbury, MA (US); Edward Wolfe, North Andover, MA (US); Steven Sherman, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/775,335

(22) Filed: Feb. 25, 2013

(65) Prior Publication Data

US 2013/0168675 A1 Jul. 4, 2013

Related U.S. Application Data

(62) Division of application No. 12/907,547, filed on Oct. 19, 2010, now Pat. No. 8,421,481.

(60) Provisional application No. 61/253,326, filed on Oct. 20, 2009, provisional application No. 61/347,863, filed on May 25, 2010.

(51) Int. Cl.
*G01R 27/28* (2006.01)

(52) U.S. Cl.
USPC ............... 324/649; 324/762.01; 324/754.03; 324/762.05; 359/224.1; 438/14; 73/514.17

(58) Field of Classification Search
USPC .......................................... 324/649
See application file for complete search history.

(56) References Cited

U.S. PATENT DOCUMENTS

| | | | |
|---|---|---|---|
| 6,323,550 B1 | 11/2001 | Martin et al. ................. 257/704 |
| 7,204,737 B2* | 4/2007 | Ding et al. ....................... 445/24 |
| 7,416,984 B2 | 8/2008 | Martin et al. ................. 438/691 |
| 7,421,897 B2 | 9/2008 | Geen et al. ................ 73/504.12 |
| 7,458,263 B2 | 12/2008 | Nasiri et al. ............... 73/504.12 |
| 7,589,540 B2 | 9/2009 | Nam et al. .................... 324/713 |
| 7,705,600 B1 | 4/2010 | Byrkett ........................ 324/416 |
| 2004/0239340 A1* | 12/2004 | Tan .............................. 324/649 |
| 2007/0077667 A1* | 4/2007 | Oishi ............................. 438/14 |
| 2007/0111342 A1* | 5/2007 | Satya et al. .................... 438/17 |
| 2007/0296439 A1* | 12/2007 | Feustel et al. ................. 324/763 |
| 2008/0013144 A1* | 1/2008 | Chui et al. .................... 359/224 |

(Continued)

OTHER PUBLICATIONS

Walraven, "Failure Mechanisms in MEMS," IEEE, International Test Conference, pp. 828-833, (2003).

*Primary Examiner* — Melissa Koval
*Assistant Examiner* — Benjamin M Baldridge
(74) *Attorney, Agent, or Firm* — Sunstein Kann Murphy & Timbers LLP (57) ABSTRACT

Detecting and/or mitigating the presence of particle contaminants in a MEMS device involves converting benign areas in which particles might become trapped undetectably by electric fields during test to field-free regions by extending otherwise non-functional conductive shield and gate layers and placing the same electrical potential on the conductive shield and gate layers. Particle contaminants can then be moved into detection locations remote from the potential trap areas and having particle detection structures by providing some mechanical disturbance.

20 Claims, 9 Drawing Sheets

(56) References Cited

U.S. PATENT DOCUMENTS

| | | | |
|---|---|---|---|
| 2008/0013145 A1* | 1/2008 | Chui et al. | 359/224 |
| 2008/0106602 A1* | 5/2008 | Nussbacher | 348/187 |
| 2008/0174329 A1* | 7/2008 | Papageorgiou et al. | 324/765 |
| 2008/0267489 A1* | 10/2008 | Xiao et al. | 382/147 |
| 2009/0212793 A1* | 8/2009 | Guldi et al. | 324/751 |
| 2009/0251155 A1* | 10/2009 | Wang et al. | 324/649 |
| 2009/0315569 A1* | 12/2009 | Katsuyama et al. | 324/649 |
| 2010/0123513 A1* | 5/2010 | Kang | 327/538 |
| 2010/0257492 A1* | 10/2010 | Joshi et al. | 716/1 |
| 2011/0037484 A1* | 2/2011 | Gilbert | 324/649 |

* cited by examiner

Capped Athens Particle Electrostatic Adhesion

All rather approximate and assumes roughness of particle contact surface is small compared to glass thickness $\varepsilon := 3.9 \cdot 8.9 \cdot 10^{-12}$    glass permittivity (SiO2, F/m)
$d := 1 \cdot 10^{-6}$    glass thickness (m)
$v := 17$    particle voltage (V)
$\rho := 2333$    particle density (Si, kg/m^3)
$P$    particle thickness (m)
$A$    gross particle area (m^2)
$gn := 9.8$    gravitational accel (m/s^2)
$g := 700$    applied g's If inerial force just overcomes electrostatic attraction

$$\frac{\varepsilon}{2} \cdot \left(\frac{v}{d}\right)^2 \cdot A = \rho \cdot p \cdot A \cdot g \cdot gn$$

$$p := \frac{1}{\rho \cdot g \cdot gn} \frac{\varepsilon}{2} \cdot \left(\frac{v}{d}\right)^2$$

$$p \cdot 10^6 = 313 \text{ microns}$$

Particles of this size and smaller will stick in the region between the cap and the shield plane

DETECTION AND MITIGATION OF PARTICLE CONTAMINANTS IN MEMS DEVICES

CROSS-REFERENCE TO RELATED APPLICATION(S)

This patent application is a divisional of, and therefore claims priority from, U.S. patent application Ser. No. 12/907,547 filed Oct. 19, 2010, which claims the benefit of U.S. Provisional Patent Application No. 61/253,326 filed Oct. 20, 2009 and also claims the benefit of U.S. Provisional Patent Application No. 61/347,863 filed May 25, 2010. Each of the above-referenced patent applications is hereby incorporated herein by reference in its entirety.

TECHNICAL FIELD

The present invention relates to MEMS device, and more particularly to detection and mitigation of particle contaminants in MEMS devices.

BACKGROUND ART

Microelectromechanical system (MEMS) devices are have become established as useful commercial items. One problem that can arise in MEMS devices is that the sizes of micromachined parts are generally comparable with the sizes of airborne dust particles and so the operation of micromachines can be perturbed by dust. In particular, the operation of MEMS devices is susceptible to leakage currents conducted by particles as well as to mechanical interference. Generally speaking, the higher the electrical impedance of such systems, the higher is their vulnerability. This is particularly true for systems that are electrostatically driven and capacitively sensed, such as the majority of MEMS gyroscopes and accelerometers in mass production today.

In order to maintain high quality and reliability, the semiconductor processes used for micromachining are conducted in scrupulously clean conditions. Also, it is desirable to design the MEMS device in such a way that it is as immune as possible to such particles. In reality, perfect immunity, like perfect cleanliness, is impossible to achieve and must be supplemented. The additional measures include protection such as capping, for example, as described in U.S. Pat. Nos. 6,323,550, 7,416,984, and 7,458,263, each of which is hereby incorporated by reference in its entirety, and optical inspection or electrical test methods which detect particles so that MEMS parts containing them can be identified.

The concepts of immunity to particles and detectability by electrical test are generally at odds with one another. Generally speaking, the more immune a structure is to perturbation, the less easy it is to perceive the presence of a particle, while sensitive structures which disclose particles easily are generally not immune.

SUMMARY OF THE INVENTION

In accordance with one aspect of the invention there is provided a method for detecting particle contaminants in a MEMS device having a device structure and a sense electrode adjacent to the device structure. The method involves, during a test mode, setting impedance of the sense electrode to a predetermined test mode impedance higher than a predetermined operational mode impedance for the sense electrode, placing a test signal on the device structure, monitoring the sense electrode for leakage current from the device structure, and, during an operational mode, setting impedance of the sense electrode to the predetermined operational mode impedance.

In accordance with another aspect of the invention there is provided a MEMS device comprising a device structure; a sense electrode adjacent to the device structure; and a particle detecting controller coupled to the device structure and the sense electrode. The controller includes a test mode in which the controller sets impedance of the sense electrode to a predetermined test mode impedance higher than a predetermined operational mode impedance for the sense electrode, places a test signal on the device structure, and monitors the sense electrode for leakage current from the device structure. The controller also includes an operational mode in which the controller sets impedance of the sense electrode to the predetermined operational mode impedance.

In various alternative embodiments of the above method and apparatus, setting impedance of the sense electrode to the predetermined test impedance may involve setting the bias of a direct current amplifier feedback circuit of a low-noise charge amplifier having an input coupled to the sense electrode to a predetermined test mode bias. The predetermined test mode impedance may be around 2 TOhms and the predetermined operational mode impedance may be around 2 GOhms. The sense electrode may be a fixed electrode (e.g., a fixed sensing finger or a ground plane) and the device structure may be a movable electrode or a fixed electrode. The device structure may be a guard structure that is used during the test mode for detecting particle contaminants and is placed at the same potential as the sense electrode during the operational mode. Such a guard structure may include a set of elongated fingers, and the sense electrode may be an elongated sense electrode having a proximal portion that interdigitates with the set of elongated fingers and a distal portion that interdigitates with corresponding fingers of a movable mass.

In accordance with another aspect of the invention there is provided a MEMS device comprising a fixed sense electrode; a guard structure adjacent to the fixed sense electrode; and a controller coupled to the fixed sense electrode and the guard structure. The controller includes a test mode in which the controller places the guard structure at a different electrical potential than the fixed sense electrode and monitors the fixed sense electrode for leakage current from the guard structure and an operational mode in which the controller places the guard structure at the same electrical potential as the fixed sense electrode.

In various alternative embodiments, the guard structure may include a set of finger structures and the fixed sense electrode may include a proximal portion that interdigitates with the set of finger structures of the guard structure. The MEMS device may further include a movable mass having a set of finger structures, and the fixed sense electrode may include a distal portion that interdigitates with the finger structures of the movable mass. The controller may set impedance of the sense electrode to a predetermined test mode impedance higher than a predetermined operational mode impedance during the test mode and may set impedance of the sense electrode to the predetermined operational mode impedance during the operational mode. The controller may include a low-noise charge amplifier having an input coupled to the sense electrode and including a direct current amplifier feedback circuit, and the controller may set impedance of the sense electrode to the predetermined test impedance by setting the bias of the direct current amplifier feedback circuit to a predetermined test mode bias. The predetermined test mode impedance may be around 2 TOhms and the predetermined operational mode impedance may be around 2 GOhms.

In accordance with another aspect of the invention there is provided a MEMS device comprising a substrate supporting a set of device structures; a conductive shield layer partially covering a surface of the substrate and leaving an uncovered potential trap region; a conductive gate layer embedded within the substrate, the conductive gate layer having a first extended portion underlying the potential trap region; and a controller coupled to the conductive shield layer and the conductive gate layer and configured to place the same electrical potential on both the conductive shield layer and the conductive gate layer.

In various alternative embodiments, the MEMS device may additionally include a device cap bonded to the substrate and covering the device structures. The conductive gate layer may include a second extended portion that extends beyond an outer perimeter of the device cap to which the controller connects.

Various aspects of the present invention can be applied generally to integrated circuit devices and are not necessarily limited to MEMS devices and/or to particle detection. For example, embodiments of the present invention may include integrated circuit devices comprising vulnerable, exposed sensitive nodes that can be switched between a very sensitive condition for test purposes and a less sensitive condition for operational purposes. The nodes may be part of or connected to a MEMS structure.

BRIEF DESCRIPTION OF THE DRAWINGS

The foregoing features of the invention will be more readily understood by reference to the following detailed description, taken with reference to the accompanying drawings, in which.

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

Definitions. As used in this description and the accompanying claims, the following terms shall have the meanings indicated, unless the context otherwise requires.

A "set" includes one or more elements.

An "electrode" is a structure through which an electrical or electromechanical effect is applied and/or sensed. In exemplary embodiments, various electrodes are used for applying and/or sensing electrical or electromechanical effects through capacitive coupling, although it should be noted that other types of electrodes and couplings may be used (e.g., piezoelectric).

Various embodiments of the present invention detect and/or mitigate the presence of particle contaminants using one or more of the following detection/mitigation schemes:

(1) including MEMS structures that in normal operation are robust against the presence of particles but which can be made sensitive to that presence during a test mode prior to use, e.g., by switching the impedance of sensitive structures between an exceptionally sensitive condition during test and a normal sensitivity during operation;

(2) surrounding sensitive nodes with guard elements that are at the same potential as those nodes during operation, thereby offering protection against bridging particles, but are at a very different potential during test and reveal the particles by their resulting leakage currents;

(3) extending the sensitive nodes to interdigitate with or otherwise extend adjacent to the guard structures, which neither contribute to nor detract from the device operation but cover otherwise open areas with detection means during test. This increases the probability of detection of particles which might subsequently move from a benign location to an interfering location; and/or (4) converting benign areas in which particles might become trapped undetectably by electric fields during test to field-free regions by extending otherwise non-functional conductive layers so that the particles can then be moved into detection locations by providing some mechanical disturbance in accordance with existing practices.

Figure 1:
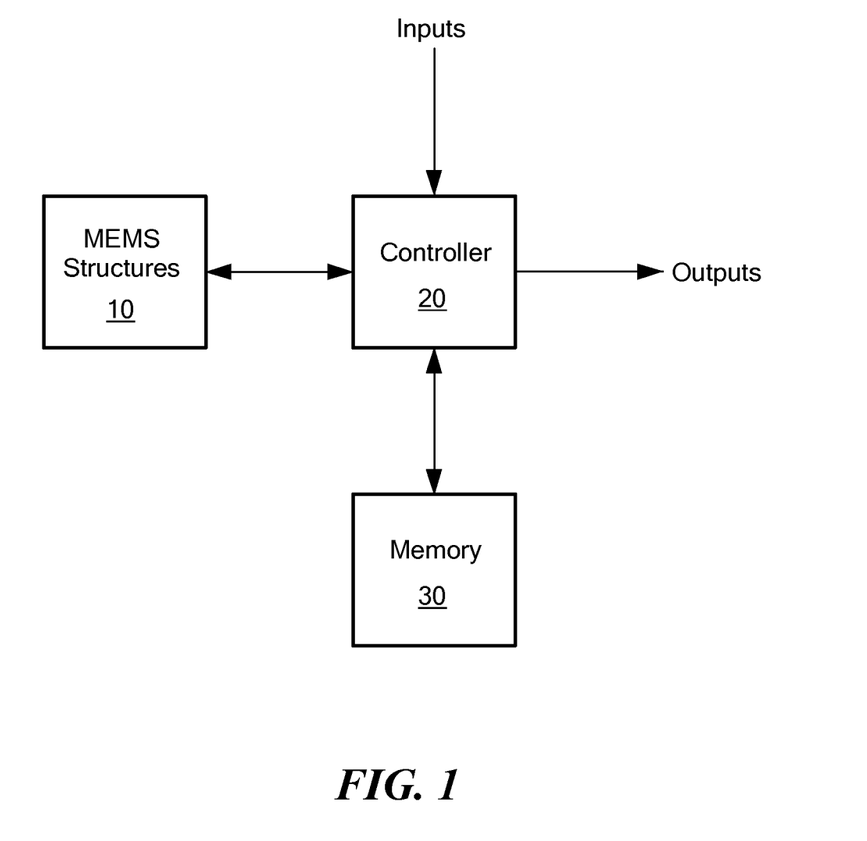
FIG. 1 is a schematic diagram conceptually showing relevant components of a MEMS device, in accordance with an exemplary embodiment of the present invention.

FIG. 1 is a schematic diagram conceptually showing relevant components of a MEMS device, in accordance with an exemplary embodiment of the present invention. Among other things, the MEMS device includes various MEMS structures 10, a controller 20 coupled to the MEMS structures 10, and a memory 30 coupled to the controller 20.

MEMS devices may include such things as gyroscopes (e.g., as discussed in U.S. Pat. Nos. 6,505,511, 6,877,374, 7,421,897, and 5,635,640, which are assigned to Analog Devices, Inc. of Norwood, Mass. and are hereby incorporated herein by reference in their entireties), accelerometers (e.g., as discussed in U.S. Pat. Nos. 5,939,633 and 6,892,576, which are assigned to Analog Devices, Inc. of Norwood, Mass. and are hereby incorporated herein by reference in their entireties), microphones and pressure sensors (e.g., as discussed in U.S. patent application publication number US2006/0237806, which is hereby incorporated by reference in its entirety), optical switches (e.g., as discussed in U.S. Pat. Nos. 6,940,636 and 6,625,345, which are assigned to Analog Devices, Inc. of Norwood, Mass. and are hereby incorporated herein by reference in their entireties), electrometers (e.g., as described in U.S. Pat. No. 7,098,644, which is assigned to Analog Devices, Inc. of Norwood, Mass. and is hereby incorporated herein by reference in its entirety), flow sensors (e.g., as described in U.S. patent application publication number US2008/0264181, which is assigned to Analog Devices, Inc. of Norwood, Mass. and is hereby incorporated herein by reference in its entirety), position sensors (e.g., as described in U.S. Pat. No. 6,713,829, which is assigned to Analog Devices, Inc. of Norwood, Mass. and is hereby incorporated herein by reference in its entirety), switches, and RF devices, to name but a few.

Generally speaking, a MEMS device includes at least one movable structure (referred to hereinafter for convenience as a "proof mass"), although some MEMS devices (e.g., convective accelerometers as described in U.S. patent application publication number US2005/0205959, which is assigned to Analog Devices, Inc. of Norwood, Mass. and is hereby incorporated herein by reference in its entirety) may have no overtly moving parts. In any case, a MEMS device may be a MEMS-only device (i.e., with structure only), or an integrated MEMS having both structure and circuitry, such as an IMEMS™ inertial sensor distributed by Analog Devices, Inc. of Norwood, Mass.

With reference again to FIG. 1, in MEMS devices such as MEMS gyroscopes and accelerometers, the MEMS structures 10 typically include various types of drive and/or sense structures including mechanical moving parts (e.g., resonator shuttles, sensor frames, etc.) with low electrical impedance and high signal voltages adjacent to sensitive parts (e.g., fixed sensing structures, referred to hereinafter as sense electrodes) with high impedance. Movement of such moving parts is detected by low level signals induced in the sense electrodes due to changes in capacitance between the moving parts and the sense electrodes. The controller 20 provides electrical connections to the various MEMS structures, e.g., for driving and/or sensing movement of a movable mass. The controller 20 receives various inputs (e.g., power signals from a power supply, temperature signals from the temperature sensor) and provides various outputs (e.g., output signals representing movement of the MEMS device). Also, the controller 20 obtains various types of operating parameters from the memory 30, e.g., a transduction scale factor used to convert sensed acceleration signals to device outputs.

Figure 2:
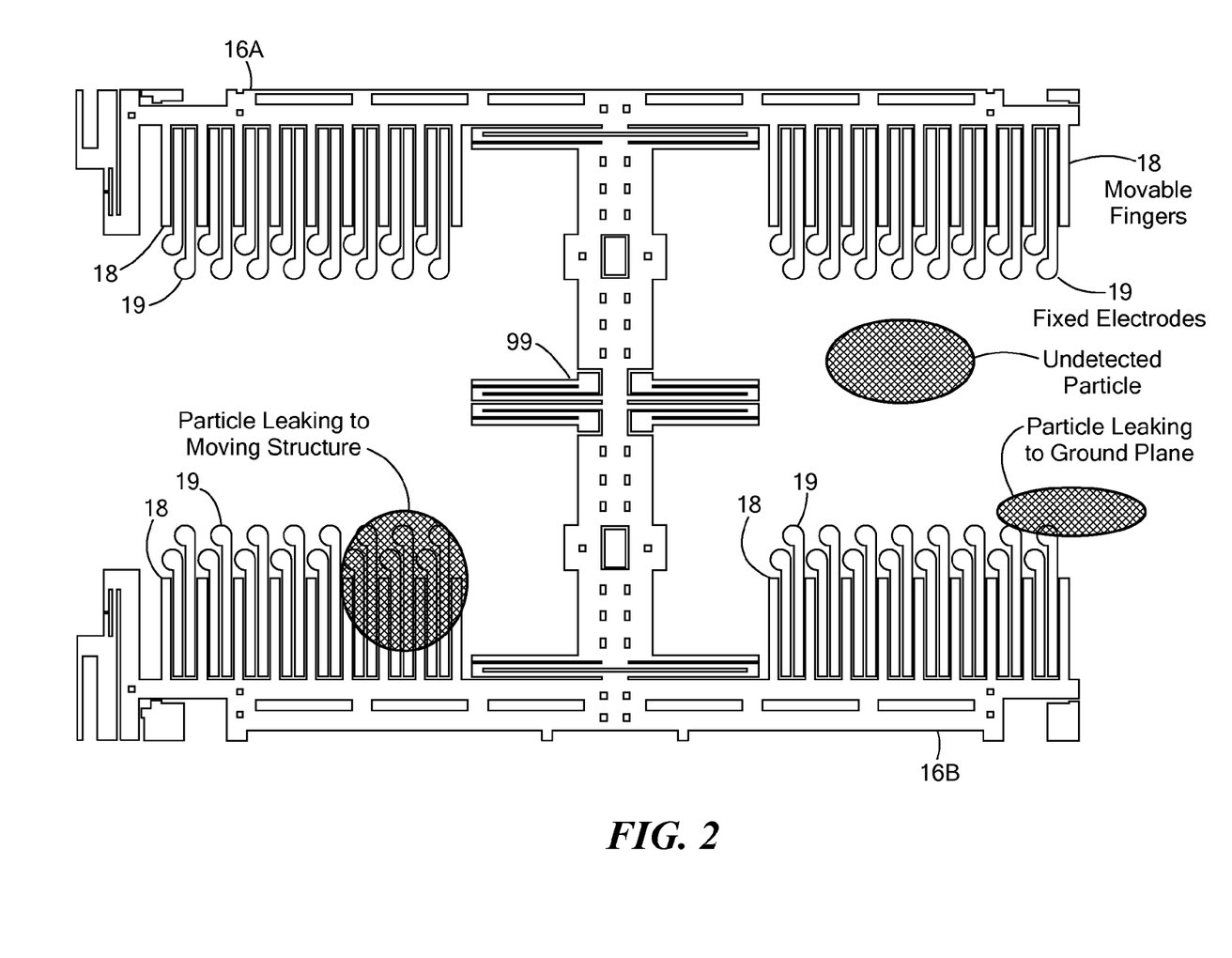
FIG. 2 is a schematic diagram showing a portion of a MEMS device in accordance with one exemplary embodiment of the present invention, highlighting some of the problems that may occur with particle contaminants.

FIG. 2 is a schematic diagram showing the MEMS structures of a portion of a MEMS gyroscope in accordance with one exemplary embodiment of the present invention. Here, two movable masses 16A and 16B (e.g., frames of two coupled sensor elements) are interconnected by a coupling apparatus 99, similar to the configuration shown in FIG. 3 of U.S. Pat. No. 7,421,897, which is hereby incorporated herein by reference in its entirety. Each of the movable masses 16A and 16B includes sets of fingers 18 that move along with the mass. For convenience, the fingers 18 may be referred to hereinafter as "movable" fingers. The movable fingers are interdigitated with corresponding sets of fixed fingers 19. The fixed fingers 19 are anchored to an underlying substrate (which also supports the movable masses and other device structures and typically includes a ground plane electrode) but are electrically isolated from the ground plane so that different electrical potentials can exists on the fixed fingers 19 and the ground plane. A high voltage potential is placed on the masses (and hence on the movable fingers 18), and movement of the masses is detected by changes in capacitance between the movable fingers 18 and the fixed fingers 19, specifically by detecting the low level signals induced in the fixed fingers 19 using appropriate circuitry (an example of which is discussed below).

Similar configurations of interdigitated electrodes can be used to drive movement of a mass, e.g., by placing alternating electrical signals on the fixed fingers that cause resulting movement of the mass. Also, electrodes for driving and/or sensing movement are not limited to interdigitated configurations. Rather, MEMS devices often include one or more electrodes that sit adjacent to a portion of a movable mass, e.g., for testing, sensing, or adjusting movement of the mass.

Furthermore, MEMS devices may have multiple moving masses and/or masses that move in multiple planes (e.g., resonating in an X-Y plane and deflecting in a Z-axis outside of that plane due to Coriolis forces), with corresponding sets of drive and/or sense electrodes. For example, the portion of the MEMS gyroscope shown in FIG. 2 is part of a larger structure in which the movable masses 16A and 16B are frames that in turn support resonator masses that have associated sets of drive and sense electrodes, as shown and described in U.S. Pat. No. 7,421,897, which is hereby incorporated herein by reference in its entirety.

FIG. 2 depicts some of the problems that may occur with particle contaminants in a MEMS device. For example, particles may cause leakage between adjacent device layer structures (e.g., between a movable finger and a fixed drive or sense finger or between two fixed fingers) or may cause leakage between a device layer structure and the ground plane (e.g., between a fixed finger or movable mass and the underlying ground plane). Also, there typically are large, open areas where particles can migrate or adhere without being detected. Furthermore, electrical fields at various locations may cause temporary stiction of particles, which later can become dislodged and cause problems.

As discussed above, sense electrodes are typically high impedance structures and typically are connected to the inputs of low-noise charge amplifier. If a particle bridging two structures causes leakage current to the input of such an amplifier, e.g., from a surrounding ground plane or adjacent high potential part, then the output of the amplifier generally will imbalance except under extremely improbable circumstances. The size of that imbalance generally increases with the input impedance and can be detected when it exceeds a predetermined normal offset range of the amplifier.

Figure 3:
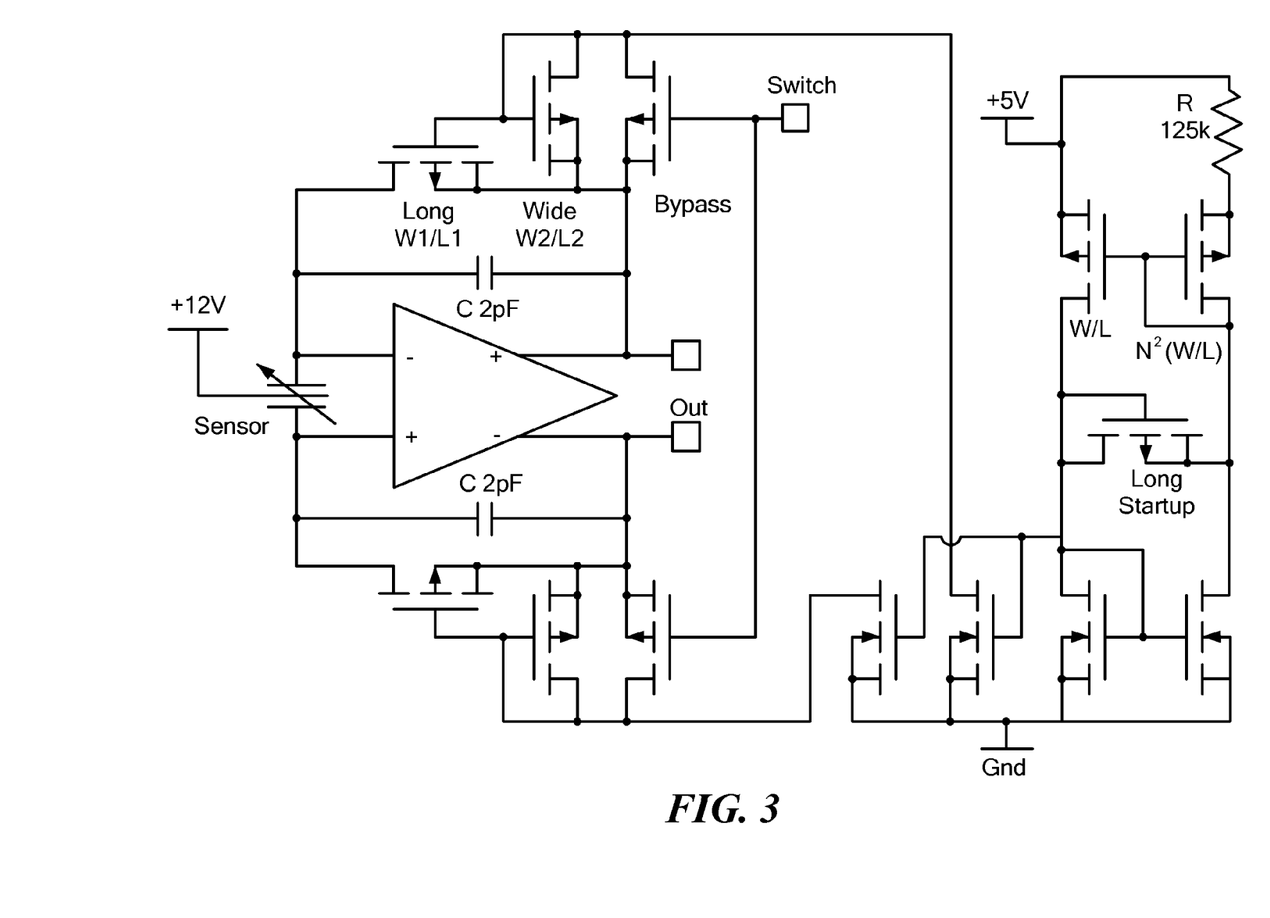
FIG. 3 is a schematic diagram showing a low-noise charge amplifier with variable input impedance, in accordance with an exemplary embodiment of the present invention.

In certain embodiments of the present invention, the input impedance of the low-noise charge amplifier is switched between an exceptionally sensitive condition during a test mode and a normal sensitivity during an operational mode. FIG. 3 shows a low-noise charge amplifier with variable input impedance, in accordance with an exemplary embodiment of the present invention. The input impedance can be changed by changing the bias of the direct current amplifier feedback circuit. There are many ways of achieving this but one illustrated in FIG. 3 involves changing the voltage state of the point labeled "switch." In an exemplary embodiment, the impedance can be changed between an operating level of around 2 GOhms to a thousand times more sensitive value of around 2 TOhms during the test mode. During testing, a high voltage signal may be placed on the movable fingers 18, and the input impedance for the sense electrodes 19 may be increased in order to increase sensitivity to leakage currents between the movable fingers 18 and the sense electrodes 19 caused by particles that bridge the gap between a movable finger 19 and a sense electrode 19.

Figure 4:
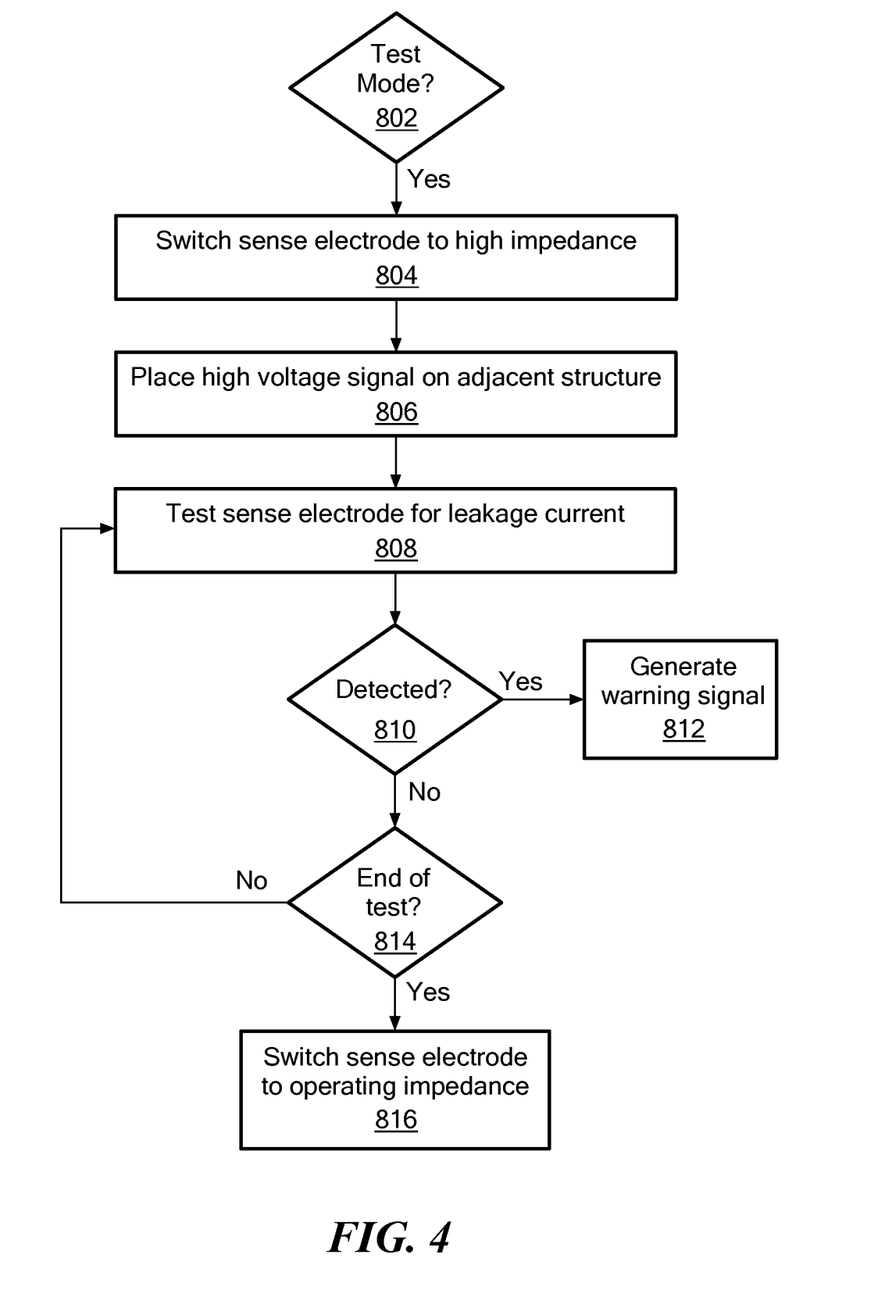
FIG. 4 is a logic flow diagram for a test mode in which sense electrodes are switched to high impedance, in accordance with an exemplary embodiment of the present invention.

FIG. 4 is a logic flow diagram for a test mode in which sense electrodes are switched to high impedance, in accordance with an exemplary embodiment of the present invention. When the device is placed in a test mode for a particular phase of testing (YES in block 802), the sense electrodes are switched to high impedance in block 804, as discussed above. A high voltage signal is placed on an adjacent structure such as a movable mass, in block 806, and the sense electrodes are tested or otherwise monitored for leakage current, in block 808. If leakage current is detected (YES in block 810), the a warning signal may be generated, in block 812. If no leakage current is detected (NO in block 810), then at the end of the test phase (YES in block 814), the sense electrodes are switched to an operating impedance.

Embodiments of the present invention additionally or alternatively may include guard structures placed adjacent to sense electrodes (e.g., at least partially protecting the sense electrodes on one or more sides). These guard structures are placed at the same potential as the sense electrodes during operation, thereby offering protection against particles, but are placed at a very different potential (e.g., a high voltage potential) during test to reveal the particles by their resulting leakage currents, e.g., to the sense electrodes or ground plane. Furthermore, the sense electrodes may be longitudinally extended so as to interdigitate with or otherwise extend adjacent to the guard elements.

Figure 5:
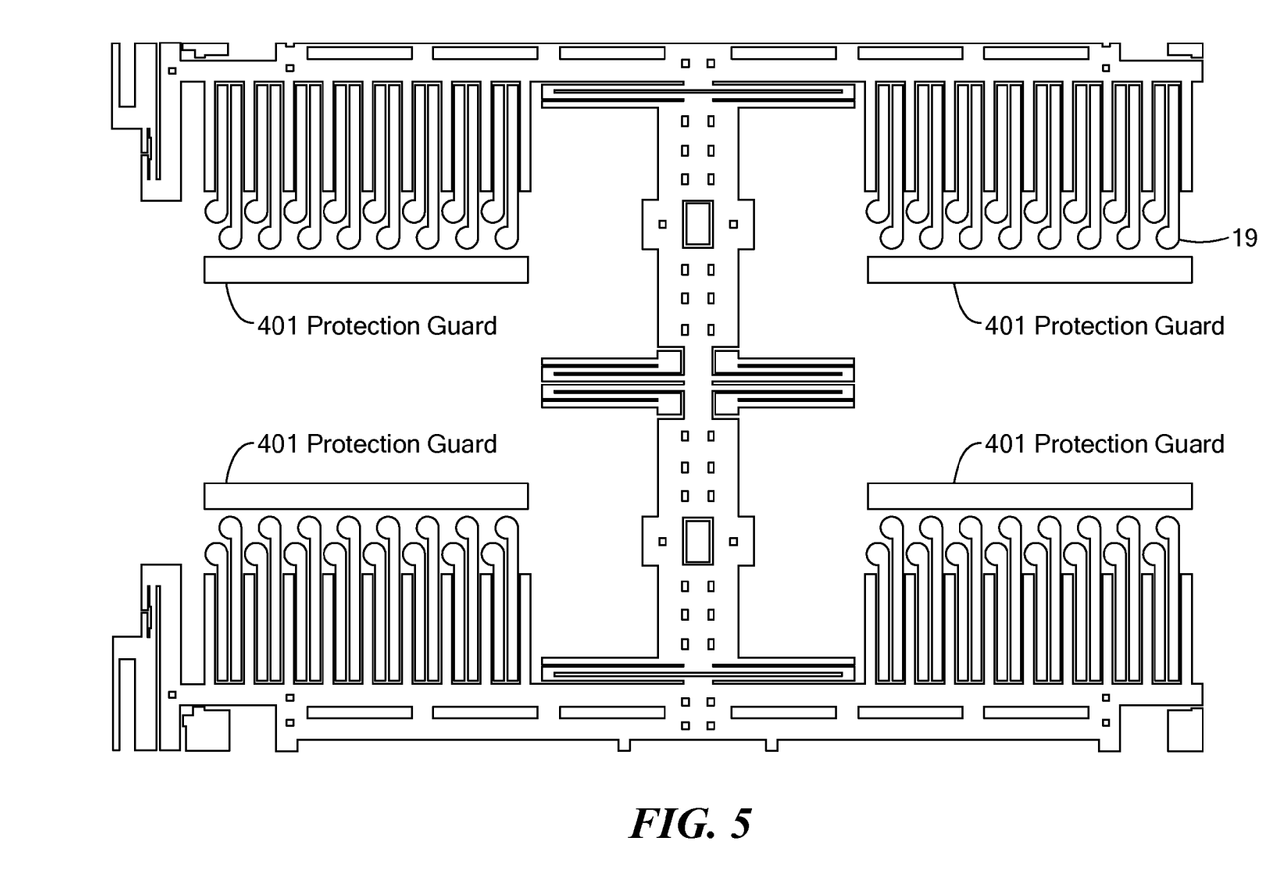
FIG. 5 is a schematic diagram showing exemplary guard structures in accordance with an exemplary embodiment of the present invention.

FIG. 5 is a schematic diagram showing exemplary guard structures in accordance with one exemplary embodiment of the present invention. Here, each guard structure 401 is essentially an elongated bar that sits adjacent to a set of fixed fingers 19.

Figure 6:
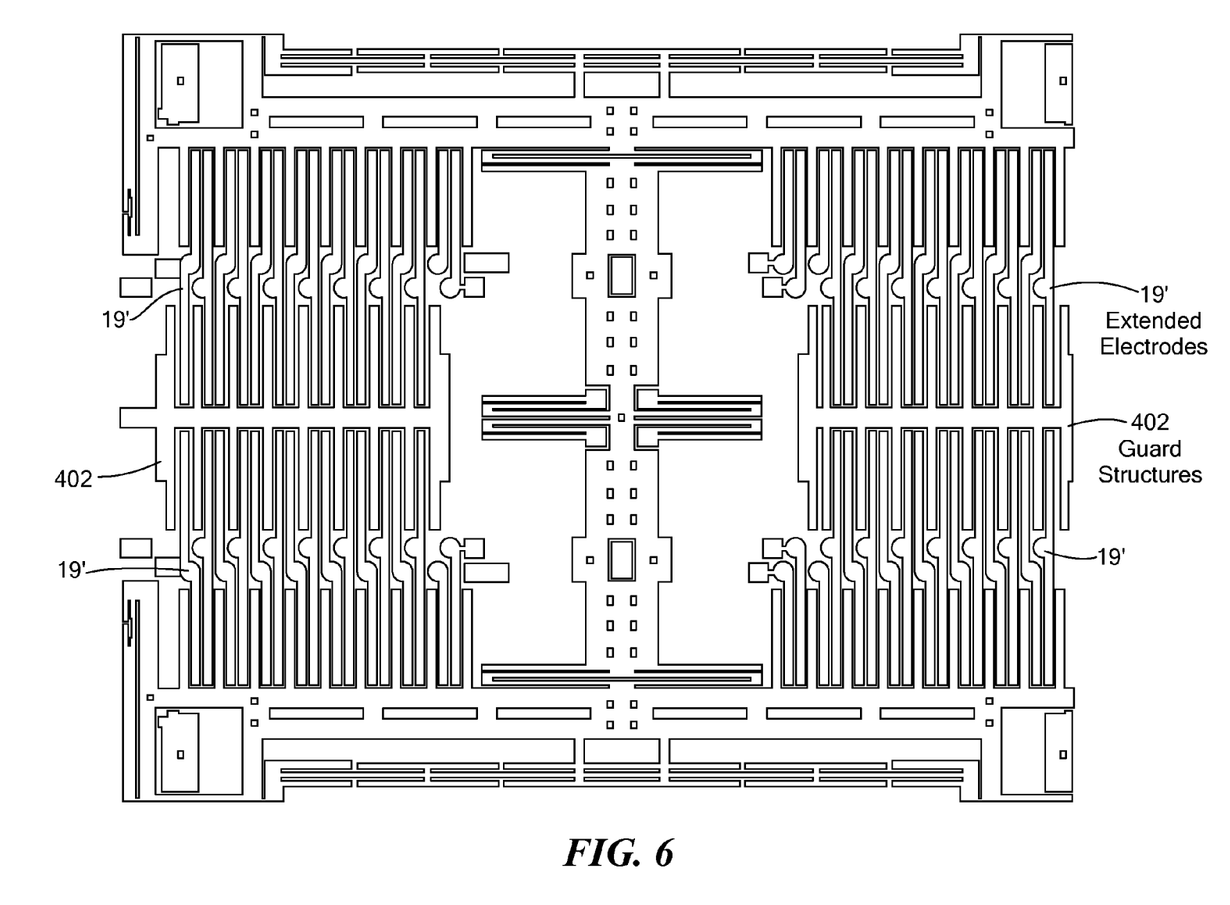
FIG. 6 is a schematic diagram showing exemplary guard structures having elongated fingers interdigitated with elongated sense electrodes, in accordance with an exemplary embodiment of the present invention.

FIG. 6 is a schematic diagram showing exemplary guard structures having elongated fingers interdigitated with elongated sense electrodes, in accordance with another exemplary embodiment of the present invention. Here, each guard structure 402 includes sets of elongated fingers that interdigitate with corresponding portions of the sense electrodes, which are longitudinally extended (and hence are referenced as sense electrodes 19'). Thus, the extended sense electrodes 19' interdigitate on one end with the movable fingers 18 for sensing movement of the movable fingers 18 and interdigitate on the other end with the guard structure 402 fingers. This configuration has the advantage of covering with detection means areas which might otherwise harbor an undetected particle. However, it also increases stray capacitance on the amplifier input nodes, which, in turn, can degrade performance by increasing its noise gain. This stray capacitance can be overcome, for example, by connecting the guard to the output of the amplifier so that the stray capacitance becomes part or all of the feedback capacitance marked C in FIG. 3.

During testing, a high voltage may be placed on the movable fingers 18 and the guard elements 402 (at the same time or at different times), and the input impedance for the sense electrodes 19' may be increased in order to increase sensitivity to particles.

With guard elements placed adjacent to the sense electrodes, a particle by its side generally does no damage because it does not touch the sense electrode. If a particle is undetected and during operation moves on top of the structures, then, because the guard elements are at the same potential as the sense electrodes, no current flows and no harm is done, so the guard elements confer a level of immunity to such particles. In test mode, however, the guard elements are typically switched to a high potential so that a bridging particle causes current to flow to the sense electrode, which confers a level of detectability. Similarly, a high voltage signal may be placed on the movable fingers 18 (either at the same time that the high voltage signal is placed on the guard structures or at a different time) so that a bridging particle causes current to flow to the sense electrode. As discussed above, during the test mode, input impedance for the sense electrodes may be increased in order to increase sensitivity to particles.

With reference again to FIGS. 5 and 6, it should be noted that testing may be performed at different times on different sets of structures. For example, with reference again to FIG. 4, testing may be done between the movable fingers 18 and the sense electrodes 19/19', between the guard structures 401/402 and the sense electrodes 19/19', and between any of these structures and the underlying ground plane. In this regard, a particular structure may be configured as the sense electrode for one test and as the high voltage electrode for another test. Additionally or alternatively, corresponding pairs of structures may be tested sequentially (e.g., in one phase of testing, a high voltage signal may be placed on the movable fingers 18 while the sense electrodes 19/19' are at a high impedance, and in another phase of testing, a high voltage signal may be placed on the guard structures 401/402 while the sense electrodes 19/19' are at a high impedance) or multiple pairs of structures may be tested at one time (e.g., high voltage signals may be placed on both the movable fingers 18 and the guard structures 401/402 while the sense electrodes 19/19' are at a high impedance).

Figure 7:
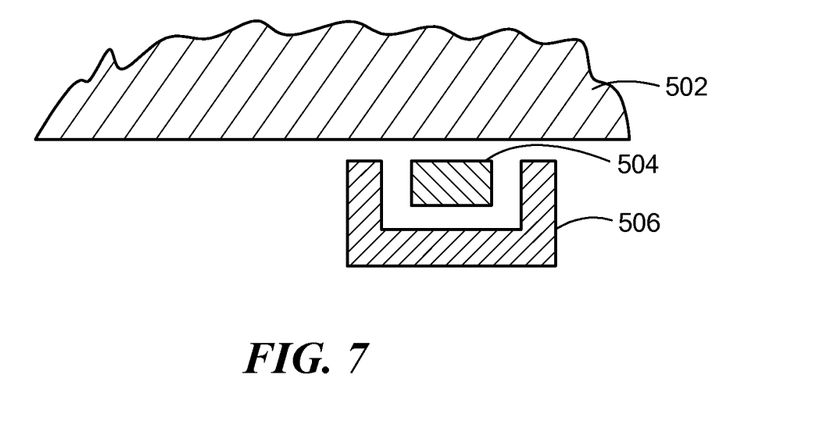
FIG. 7 is a schematic diagram showing an alternative guard structure in accordance with another exemplary embodiment of the present invention.

While exemplary embodiments are described above with reference to switching the sensitivity of sense electrodes, adding guard structures around sense electrodes, and/or extending sense electrodes, it should be noted that similar mechanisms may be used for drive and other "active" electrodes. For example, an electrode used for imparting a force on a movable mass (e.g., a drive, trim, or self-test electrode) may be surrounded by a guard structure that is used in conjunction with the electrode for sensing particles during a test mode but that is placed at a benign potential during operation. FIG. 7 shows an exemplary configuration including a movable mass 502, a trim electrode 504 adjacent to the movable mass 502, and a guard structure 506 surrounding the trim electrode 504, with either the guard structure 506 or the trim electrode 504 configured as the sensitive node during testing and the guard structure 506 switched to a benign potential during operation. Thus, principles described above may be applied to both movable electrodes and stationary electrodes in various types of MEMS devices.

Figure 8:
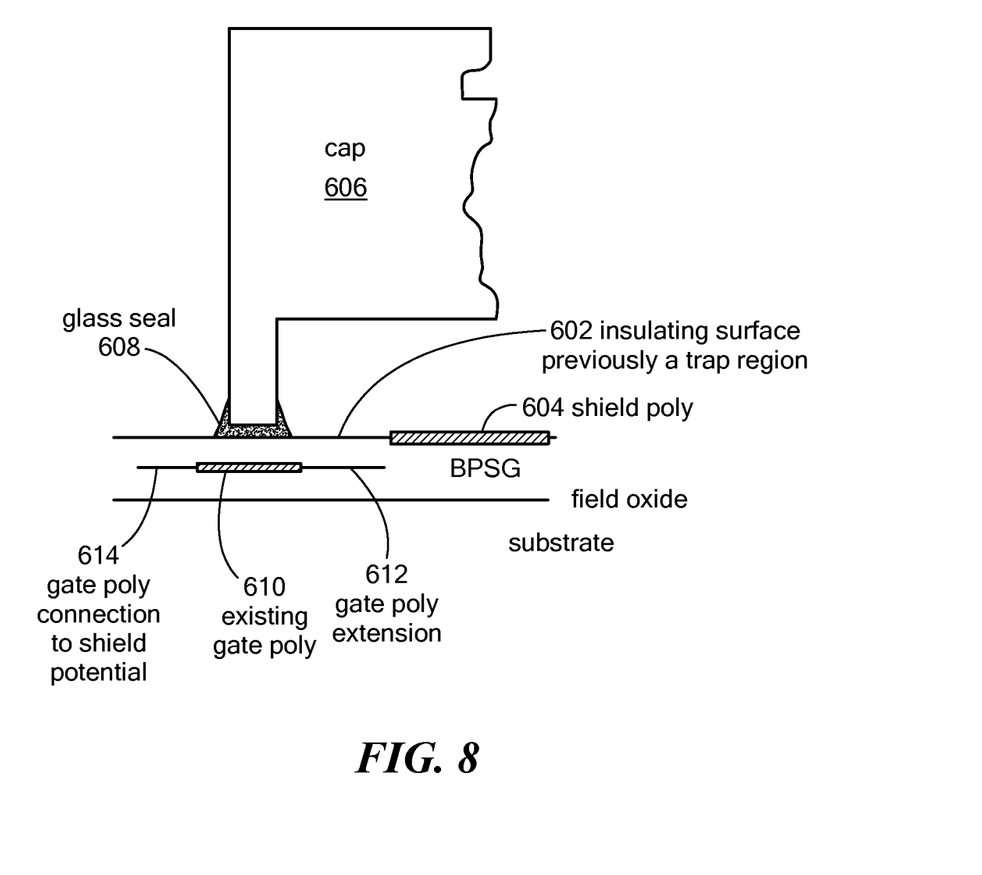
FIG. 8 is a schematic diagram depicting an exemplary configuration for eliminating trap regions, in accordance with an exemplary embodiment of the present invention.
Figure 9:
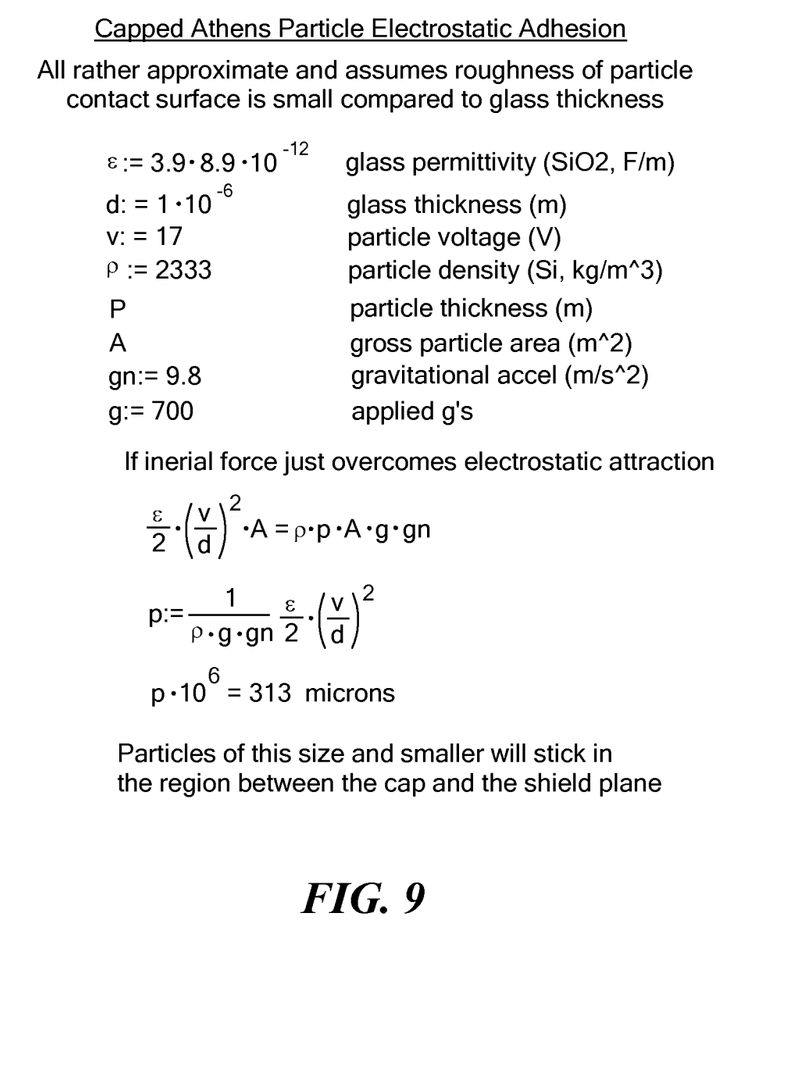
FIG. 9 shows an approximation for the size of particles susceptible to stiction in trap regions, in accordance with an exemplary embodiment of the present invention.

MEMS devices often have regions in which particles can become trapped undetectably by electric fields. For example, particles may adhere to insulating surface 602 between a shield polysilicon layer 604 and the glass seal 608 of a device cap 606 through electrostatic adhesion, as depicted in FIG. 8. As a very rough estimate, particles having a thickness of around 313 microns or less may be susceptible to stiction in an exemplary MEMS device based on the approximation shown in FIG. 9 which refers to a potential of 17V between the substrate 616 and shield 604 or cap 606.

Therefore, embodiments of the present invention additionally or alternatively may eliminate such trap regions by extending otherwise non-functional conductive layers to produce substantially field-free regions. For example, with reference again to FIG. 8, the existing gate polysilicon layer 610 of a MEMS device layout may be extended both underneath the trap region 602 as represented by gate poly extension 612 and outside of the perimeter of the cap to provide a gate poly extension 614 that is connected to the potential of the shield poly 604. With the trap region reduced or eliminated, any particles in the trap region can be moved into detection locations during a test mode by providing a mechanical disturbance in accordance with known practices. Furthermore, connections to sensitive nodes (e.g., sense electrodes) that need not be raised above the ground plane to fulfill their mechanical function are buried beneath the ground plane and insulated, e.g., by a layer of oxide, nitride or glass, both above and below. Thus, these portions of the nodes are immune to particles.

Figure 10:
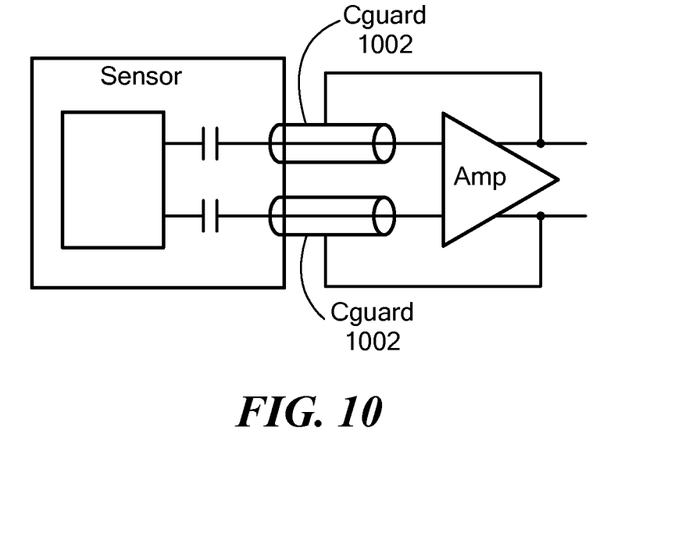
FIG. 10 is a schematic diagram showing guarding of the signal lines between the sensor and the amplifier with the guards being driven by the amplifier outputs so that the stray capacitance becomes part or all of the feedback capacitance, in accordance with an exemplary embodiment of the present invention.

As discuss above, stray capacitance on the amplifier input nodes (e.g., on the signal lines from the sensor to the amplifier) can degrade performance by increasing noise gain without correspondingly increasing signal gain (similarly, any leakage at these nodes, for example, due to particle contaminants, can degrade performance). These issues can be overcome by using this capacitance as the integrating feedback path for the amplifier, for example, by guarding the signal lines between the sensor and the amplifier, with the guards 1002 being driven by the amplifier outputs so that the stray capacitance becomes part or all of the feedback capacitance, e.g., as shown schematically in FIG. 10. Such guarding of the signal lines will add capacitance to the signal lines, but by driving the guards by the amplifier outputs, the capacitance of the guards (Cguard) can be used as the feedback capacitance and the guards can be used to partially or totally replace the feedback capacitors (e.g., C in FIG. 3). In this way, as the capacitance increases, both the noise and the signal gain increase equally. The guards can be additional structures added to the device or can be as simple as the interlayer capacitance between existing layers (e.g., between the gate or sensor polysilicon layer and the ground plane layer or metalization layer).

Thus, it should be noted that various aspects of the present invention can be applied generally to integrated circuit devices and are not necessarily limited to MEMS devices and/or to particle detection. For example, embodiments of the present invention may include integrated circuit devices comprising vulnerable, exposed sensitive nodes that can be switched between a very sensitive condition for test purposes and a less sensitive condition for operational purposes. The nodes may be part of or connected to a MEMS structure.

Figure 11:
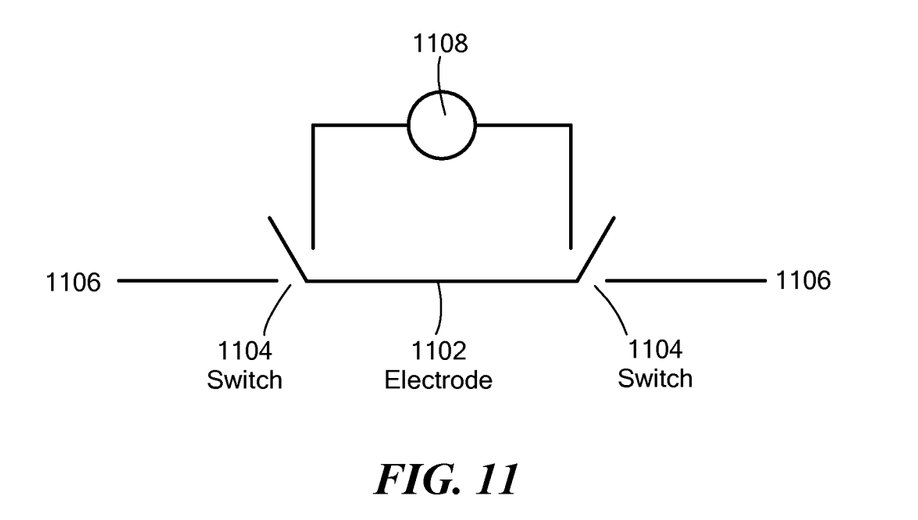
FIG. 11 is a schematic diagram showing circuitry to isolate an electrode during a test mode, in accordance with an exemplary embodiment of the present invention.

In some situations, it may be necessary or desirable to isolate an electrode or other structure during a test mode of operation, e.g., to place a high voltage signal on the node without harming other circuitry. Thus, isolation circuitry (e.g., switches) may be included to isolate such nodes during test mode and reconnect the nodes for the operational mode. FIG. 11 is a schematic diagram showing isolation circuitry for selectively isolating and reconnecting an electrode. Specifically, electrode 1102 can be selectively connected via switches 1104 to test-mode circuitry 1108 during test mode and reconnected to operational-mode circuitry 1106 during operational mode. In this way, a high voltage or other test signal can be placed on the electrode 1102 during test mode (e.g., to detect leakage caused by a particular contaminant as discussed above) without the test signal impacting the operational mode circuitry 1106.

In embodiments of the present invention, the controller 20 includes appropriate circuitry for running and switching between a test mode and an operational mode and specifically for detecting and/or mitigating particle contaminants including, for example, (1) during test mode, switching the impedance of sense electrode to a test mode impedance, placing an electrical signal on an adjacent device structure, and monitoring the sense electrode for a leakage current from the device structure, and switching the impedance of the sense electrode to an operational impedance during operational mode; (2) switching the potential and/or impedance of guard structures between a test setting and an operational setting, and/or setting the potential of a gate poly extension to that of the shield poly. This circuitry may include discrete components, integrated circuitry (e.g., an Application Specific Integrated Circuit (ASIC)), programmable logic for use with an included programmable logic device (e.g., a Field Programmable Gate Array (FPGA) or other PLD), computer program logic for use with an included processor (e.g., a microprocessor, microcontroller, digital signal processor, or general purpose computer), or any other means including any combination thereof.

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL).

Programmable logic may be fixed either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), or other memory device. The programmable logic may be fixed in a signal that is transmittable to a computer using any of various communication technologies, including, but in no way limited to, analog technologies, digital technologies, optical technologies, wireless technologies (e.g., Bluetooth), networking technologies, and internetworking technologies. The programmable logic may be distributed as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web). Of course, some embodiments of the invention may be implemented as a combination of both software (e.g., a computer program product) and hardware. Still other embodiments of the invention may be implemented as entirely hardware.

The present invention may be embodied in other specific forms without departing from the true scope of the invention. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed is:
1. A MEMS device comprising:
a substrate supporting a set of MEMS device structures;
a conductive shield layer partially covering a surface of the substrate and leaving an uncovered potential trap region;
a conductive gate layer embedded within the substrate, the conductive gate layer having a first extended portion underlying the potential trap region; and
a controller coupled to the conductive shield layer and the conductive gate layer, the controller including circuitry to place the same electrical potential on both the conductive shield layer and the conductive gate layer such that the potential trap region becomes a substantially field-free region when the same electrical potential is placed on both the conductive shield layer and the conductive gate layer.

2. A MEMS device according to claim 1, further comprising a device cap bonded to the substrate and covering the device structures, wherein the conductive gate layer includes a second extended portion that extends beyond an outer perimeter of the device cap, and wherein the controller connects to the second extended portion to place the electrical potential on the conductive gate layer.

3. A MEMS device according to claim 1, wherein the controller circuitry connects the conductive gate layer to the potential of the conductive shield layer.

4. A MEMS device according to claim 1, wherein the conductive shield layer comprises polysilicon.

5. A MEMS device according to claim 1, wherein conductive gate layer is embedded in an oxide layer of the substrate.

6. A MEMS device according to claim 5, wherein the oxide layer supports the conductive shield layer.

7. A MEMS device according to claim 1, further comprising:
at least one particle detection structure remote from the potential trap region for detecting a particle contaminant moved from the potential trap region by a mechanical disturbance of the MEMS device.

8. A method of producing a MEMS device, the MEMS device including a substrate supporting a set of MEMS device structures, the method comprising:
forming a conductive gate layer embedded within the substrate, the conductive gate layer having a first extended portion underlying a potential trap region; and
forming a conductive shield layer partially covering a surface of the substrate and leaving the potential trap region uncovered, wherein the conductive shield layer and the conductive gate layer are configured such that the potential trap region becomes a substantially field-free region when the same electrical potential is placed on both the conductive shield layer and the conductive gate layer.

9. A method according to claim 8, further comprising:
bonding a device cap to the substrate and covering the device structures, wherein the conductive gate layer includes a second extended portion that extends beyond an outer perimeter of the device cap for placement of the electrical potential on the conductive gate layer.

10. A method according to claim 8, further comprising:
connecting the conductive gate layer to the potential of the conductive shield layer.

11. A method according to claim 8, wherein the conductive shield layer comprises polysilicon.

12. A method according to claim 8, wherein conductive gate layer is embedded in an oxide layer of the substrate.

13. A method according to claim 12, wherein the oxide layer supports the conductive shield layer.

14. A method according to claim 8, further comprising:
forming at least one particle detection structure remote from the potential trap region for detecting a particle contaminant moved from the potential trap region by a mechanical disturbance of the MEMS device.

15. A method of detecting particle contaminants in a MEMS device having a substrate supporting a set of MEMS device structures, a conductive shield layer partially covering a surface of the substrate and leaving an uncovered potential trap region, and a conductive gate layer embedded within the substrate and having a first extended portion underlying the potential trap region, the method comprising:
placing the same electrical potential on both the conductive shield layer and the conductive gate layer such that the potential trap region becomes a substantially field-free region; and
providing a mechanical disturbance to the MEMS device to move any particles from the potential trap region to at least one particle detection structure.

16. A method according to claim 15, wherein the MEMS device further comprises a device cap bonded to the substrate and covering the device structures such that the conductive gate layer includes a second extended portion that extends beyond an outer perimeter of the device cap, and wherein the method further comprises:
placing the electrical potential on the second extended portion of the conductive gate layer.

17. A method according to claim 15, wherein placing the same electrical potential on both the conductive shield layer and the conductive gate layer comprises:
connecting the conductive gate layer to the potential of the conductive shield layer.

18. A method according to claim 15, wherein the conductive shield layer comprises polysilicon.

19. A method according to claim 15, wherein conductive gate layer is embedded in an oxide layer of the substrate.

20. A method according to claim 19, wherein the oxide layer supports the conductive shield layer.

* * * * *